United States Patent
Wang et al.

(10) Patent No.: US 7,056,164 B2
(45) Date of Patent: Jun. 6, 2006

(54) METHOD FOR REPAIRING AND ASSEMBLING CONTACT IMAGE SENSOR MODULE AND STRUCTURE THEREOF

(75) Inventors: Shao-Hwa Wang, Taipei County (TW); Chi-Sheng Lin, Taipei County (TW)

(73) Assignee: Asia Tech Image Inc., Taipei County (TW)

( * ) Notice: Subject to any disclaimer, the term of this patent is extended or adjusted under 35 U.S.C. 154(b) by 12 days.

(21) Appl. No.: 10/896,907

(22) Filed: Jul. 23, 2004

(65) Prior Publication Data
US 2005/0191914 A1   Sep. 1, 2005

(30) Foreign Application Priority Data
Mar. 1, 2004   (TW) ............................... 93105325 A

(51) Int. Cl.
   *H01R 9/22*   (2006.01)

(52) U.S. Cl. ............... 439/894; 439/76.1; 439/763; 29/831; 29/402.01; 358/482

(58) Field of Classification Search ............... 439/76.1, 439/736, 894; 29/829–832, 842, 402.01, 29/402.03, 402.09, 402.14; 358/482–484
See application file for complete search history.

(56) References Cited

U.S. PATENT DOCUMENTS

| | | | | |
|---|---|---|---|---|
| 6,729,020 | B1 * | 5/2004 | Brown et al. ................. | 29/832 |
| 6,780,067 | B1 * | 8/2004 | Kono et al. ................. | 439/736 |
| 6,840,821 | B1 * | 1/2005 | Bredow et al. ............. | 439/736 |
| 2003/0076552 | A1 * | 4/2003 | Lo et al. ..................... | 358/482 |

* cited by examiner

*Primary Examiner*—Khiem Nguyen
(74) *Attorney, Agent, or Firm*—Troxell Law Office, PLLC

(57) ABSTRACT

A method for repairing and assembling contact image sensor module and structure thereof are provided. The method includes following steps: (1) making a sensor housing; (2) providing a PCB; (3) assembling the PCB into the sensor housing; (4) melting an end of a securing post located on the sensor housing and forming fastening means for fixing the PCB to the sensor housing; (5) testing the assembled CIS, if it can't pass the test, then cut off the fastening means and take away the PCB for repairing or replacing it; (6) cutting off the securing post located on the housing; (7) making an adapted post with a securing tip and fixing said adapted post to a corresponding position of the sensor housing on which the former securing post being located; (8) assembling the repaired or replaced PCB into the sensor housing, and make the securing tip of the adapted post passing through the securing hole and extending outwardly from the PCB; (9) melting the tip of the adapted post by the manner of hot-press and forming a new fastening means for fixing the repaired or replaced PCB to the sensor housing again.

15 Claims, 7 Drawing Sheets

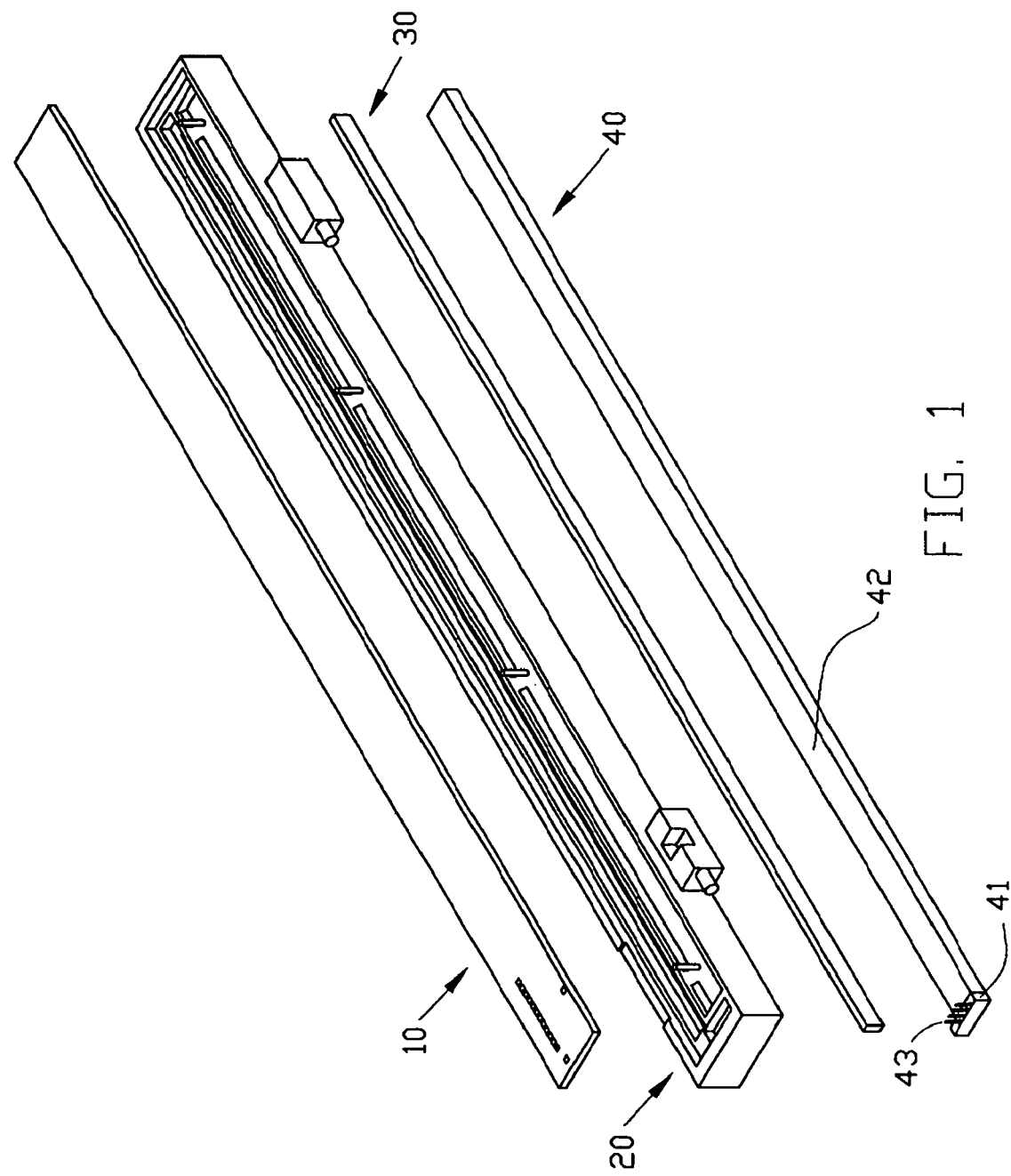

METHOD FOR REPAIRING AND ASSEMBLING CONTACT IMAGE SENSOR MODULE AND STRUCTURE THEREOF

BACKGROUND OF THE INVENTION

1. Field of the Invention

The present invention relates generally to an image sensor module, and in particular to a contact image sensor module that can be repaired when a substandard product appears and also to a method for repairing and assembling it.

2. The Related Arts

As well known, a contact image sensor (CIS) module is used as a picture image reading means in the scanner, facsimile machine, or the likes. The CIS is located on a rail means of a scanner panel, moves front-and-back and controlled by the rail and mechanical means to reading the original document that is being scanned. The obtained light signals are represented the original document and can be converted into electrical signal that will be translated into electro-image document by the software.

In general, the CIS module comprises a PCB 10, a sensor housing 20, a rod lens 30 and a light emitting diode (LED) source 40, as shown in FIG. 1.

The PCB 10 is formed by bonding photosensor elements and the electronic elements onto a special PCB. The LED source 40 comprises a LED 41 and an optical rod 42.

The CIS module's working theory is described as following paragraph. The CIS illuminates lights from the LED source 40, irradiates the lights onto the original document that is being scanned on a scanner panel, passes the lights reflected from the original document through the rod lens 30, and then transfer onto the photosensor elements, such as Charge-Coupled Device (CCD) or Complementary Metal Oxide Semiconductor (CMOS). The literal and graphic images of the original document are then recorded according to a principle that different intensity of the reflected lights that strike the photosensor elements represent different contents of the scanned document. Finally, the reflected lights will be converted into electrical signals that can be read and translated into digital pixels by the software.

The assembly process of a conventional CIS module used in the scanner generally includes two different periods.

As shown in FIGS. 2a, 2b and 2c, in the first period of the assembly process, the rod lens 30 is fixed into a lens-receiving groove 26 on a second surface 22 of the sensor housing 20. The LED source 40 is located in a light source-receiving groove 27 which extends on the second surface 22. The conductive tails of the LED source 40 pass through the holes 28 from the first surface 21 to the second surface 22 and glued to the sensor housing 20.

In the second period of assembly process, the PCB 10 will be assembled into the sensor housing 20. The prior methods for assembling the PCB 10 into the sensor housing 20 may be separated into two different types.

The first method is shown in FIG. 2c. In firstly, the PCB 10 will be put into the sensor housing 20, and then some tapping screws will pass through the predetermined holes on the PCB 10 and fix the PCB 10 in the sensor housing 20. An advantage of this method is that the assembly process is easily and rapidly. But an obvious disadvantage of this method is that the broken pieces produced by the tapping screws will be more likely to stain photosensor elements located on the PCB 10 and affect signal-receiving capabilities of the photosensor elements. Another disadvantage is that to disassembly or repair the CIS is inconvenient. During the process of disassembling and repairing the CIS, the broken pieces will be produced again and locking ability of tapping screws will be reduced because the tapping screws must be repeatedly screwed on the same positions as former.

The other prior assembly method is shown in FIGS. 3a, 3b and 3c. The sensor housing 20 is manufactured by plastic molding with a plurality of predetermined posts 11 on it. The posts 11 of the sensor housing 20 can pass through the corresponding holes 12 on the PCB 10 and extend outwardly when the PCB 10 is laid on the housing 20. Some fastening means will be formed at the tips of the posts by hot-press machine whereby the PCB 10 is fixed.

Using above method may avoid the problem of the broken pieces, but new question appears. If the assembled CIS is unqualified or has any one of the post 11 is broken during the assembly process, manufacturer must cut off all of the fastening means, disassembly them and try to repair the CIS module. But the PCB 10 can't be fixed to the housing 20 again, because the tips of the post 11 don't exist. As a result, the housing 20 will not be used again and all of the glued optical elements, such as the rod lens 30 and the LED source 40, are useless. It is obvious that the manufacturing cost will rise under this situation.

It is thus desired to provide a new method and structure that overcome the above-mentioned problems in the prior arts.

SUMMARY OF THE INVENTION

An object of the present invention is to provide a method for repairing and assembling a contact image sensor module and a structure of the CIS that can be easily repaired when a substandard product appears.

Another object of the present invention is to provide a contact image sensor module having lower manufacturing cost.

A further object of the present invention is to provide a adapted post that can be secured to a corresponding position of the post formerly located on a CIS sensor housing and was cut off because of disassembling the CIS, so that the CIS can be repeatedly repaired and assembled.

To achieve these objects, in accordance with the present invention, it provides a method for repairing and assembling contact image sensor module comprising following steps: (1) preparing a sensor housing having at least a post thereon; (2) preparing a PCB having at least a securing hole on a predetermined position thereof; (3) assembling the PCB into the sensor housing, the post of the sensor housing passing through the securing hole and extending outwardly from the PCB; (4) melting the tip of the post and forming a fastening means for fixing the PCB to the sensor housing; (5) testing the assembled CIS, if it can't pass the test, then follow next disassembly and repair steps: (6) cutting off the fastening means on the tip of the post and taking away the PCB for repairing or replacing it; (7) cutting off the post located on the sensor housing; (8) preparing adapted post having a predetermined length and fixing them to the corresponding position of the sensor housing on which the former post located; (9) assembling the repaired or replaced PCB into the sensor housing, and make the tip of the adapted post passing through the securing hole and extending outwardly from the PCB; (10) melting the tip of the adapted post by the manner of hot-press and forming fastening means for fixing the repaired or replaced PCB to the sensor housing; (11) testing the repaired CIS and repeat the steps from step (6) to step (11) until the CIS module pass the test.

The adapted post used in above method for repairing and assembling the circuit board has a predetermined length and a hollow portion at one end, the internal diameter of the hollow portion being a little larger than the outside diameter of the base portion of original post in the housing, so that said hollow portion of the adapted post can cover the base portion of the original post when repair.

The housing used in this invention comprises a first surface, a plurality of posts molded by plastic material extending from said first surface to a predetermined distance, a PCB locates spaced to said first surface of the housing and having a plurality of securing holes corresponding to said posts, and fastening means being formed at the tips of said posts which passes through and exposed to the other side of said holes. Wherein said posts have a base end connected to said first surface and the other tip end extending away from said first surface, and the outer diameter of the base portion is larger than the size of the tip portion.

BRIEF DESCRIPTION OF THE DRAWINGS

A more complete appreciation of this invention, and many of the advantages thereof will be readily apparent to those skilled in this art by reading the following description of the preferred embodiments thereof, with reference to the attached drawings, wherein:

FIG. 1 is a view of a prior structure of a contact image sensor module.

FIG. 3b is a perspective view illustrating that the PCB is assembled into the sensor housing by employing a second prior method shown in FIG. 3a.

FIG. 4b is a perspective view illustrating that the PCB is assembled into the sensor housing by employing the method shown in FIG. 4a.

DETAILED DESCRIPTION OF THE PREFERRED EMBODIMENT

The CIS in accordance with the present invention is similar to the prior CIS shown in FIG. 1. The CIS of this invention mainly comprises a PCB 10, a sensor housing 20, a rod lens 30 and a LED source 40. But the structures of the securing posts are different from the posts in prior arts.

Figure 2A:
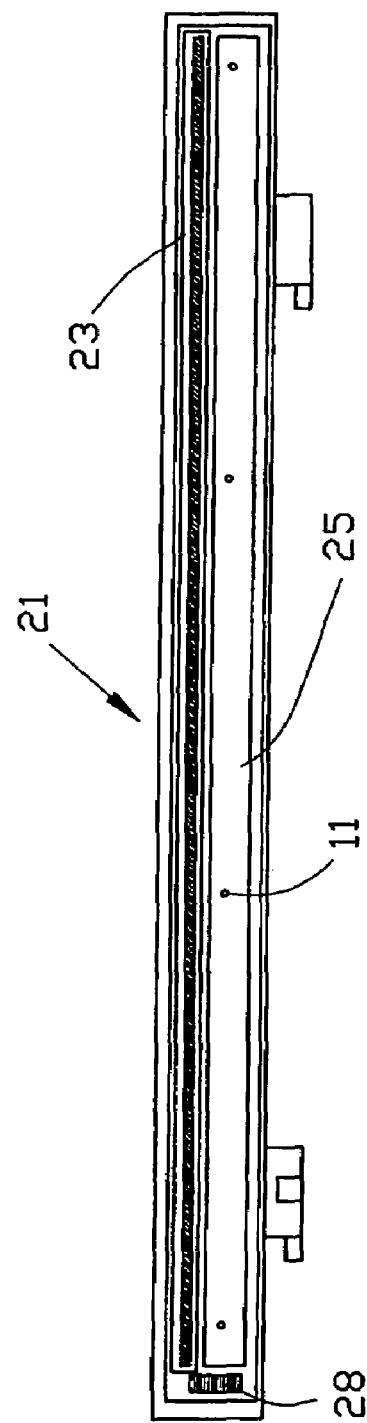
FIG. 2a is a top view illustrating a rod lens and a LED light source shown in FIG. 1 are assembled into the sensor housing.
Figure 2B:
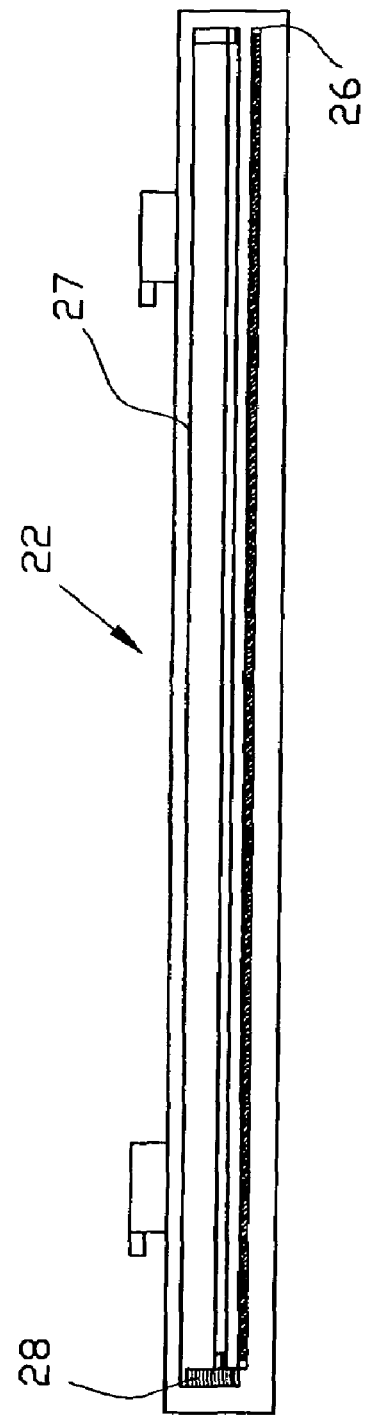
FIG. 2b is a bottom view illustrating the rod lens and the LED light source shown in FIG. 1 are assembled into the sensor housing.
Figure 2C:
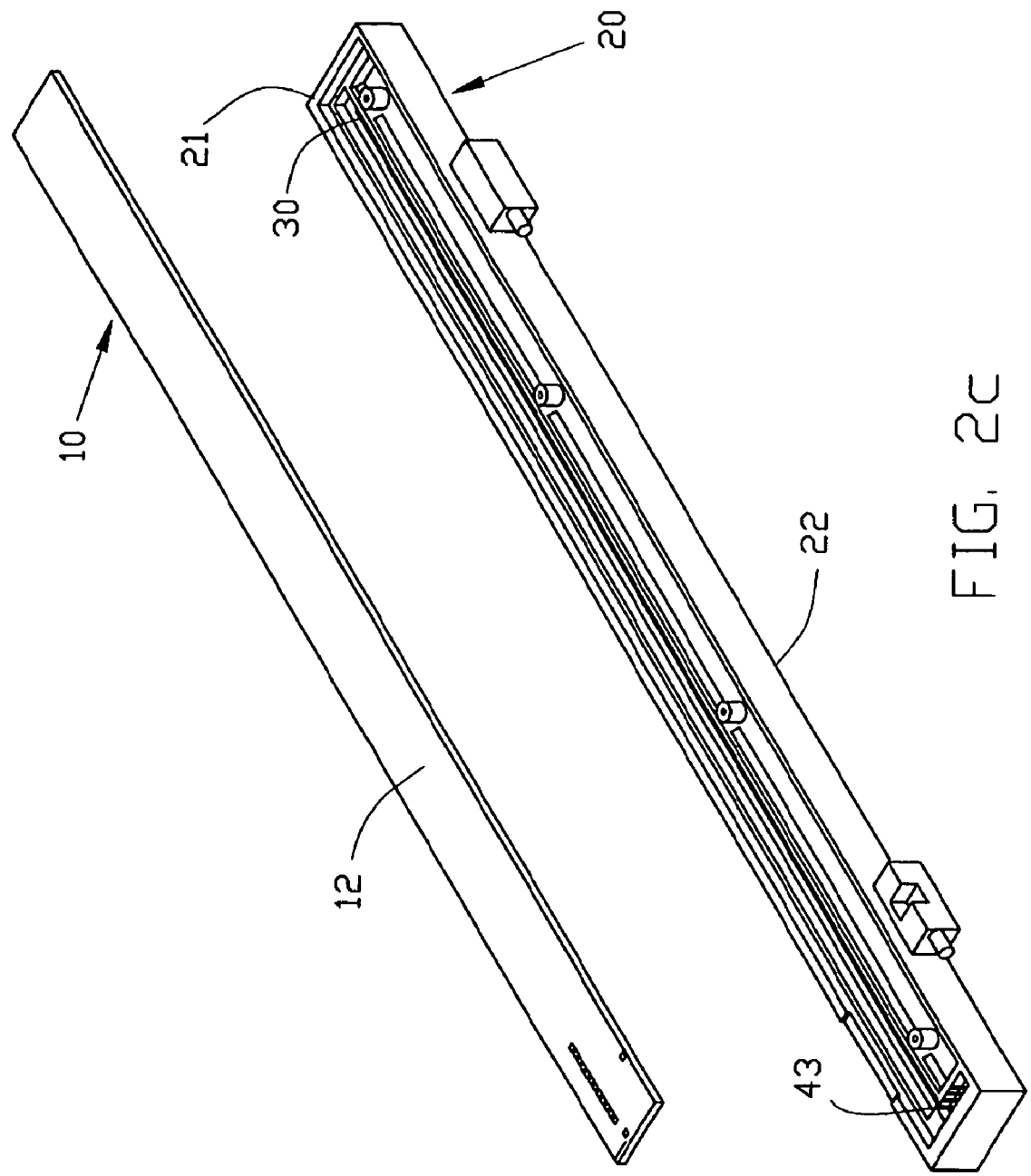
FIG. 2c is a schematic view illustrating a first prior method for assembling the PCB into the sensor housing of the prior CIS.
Figure 3A:
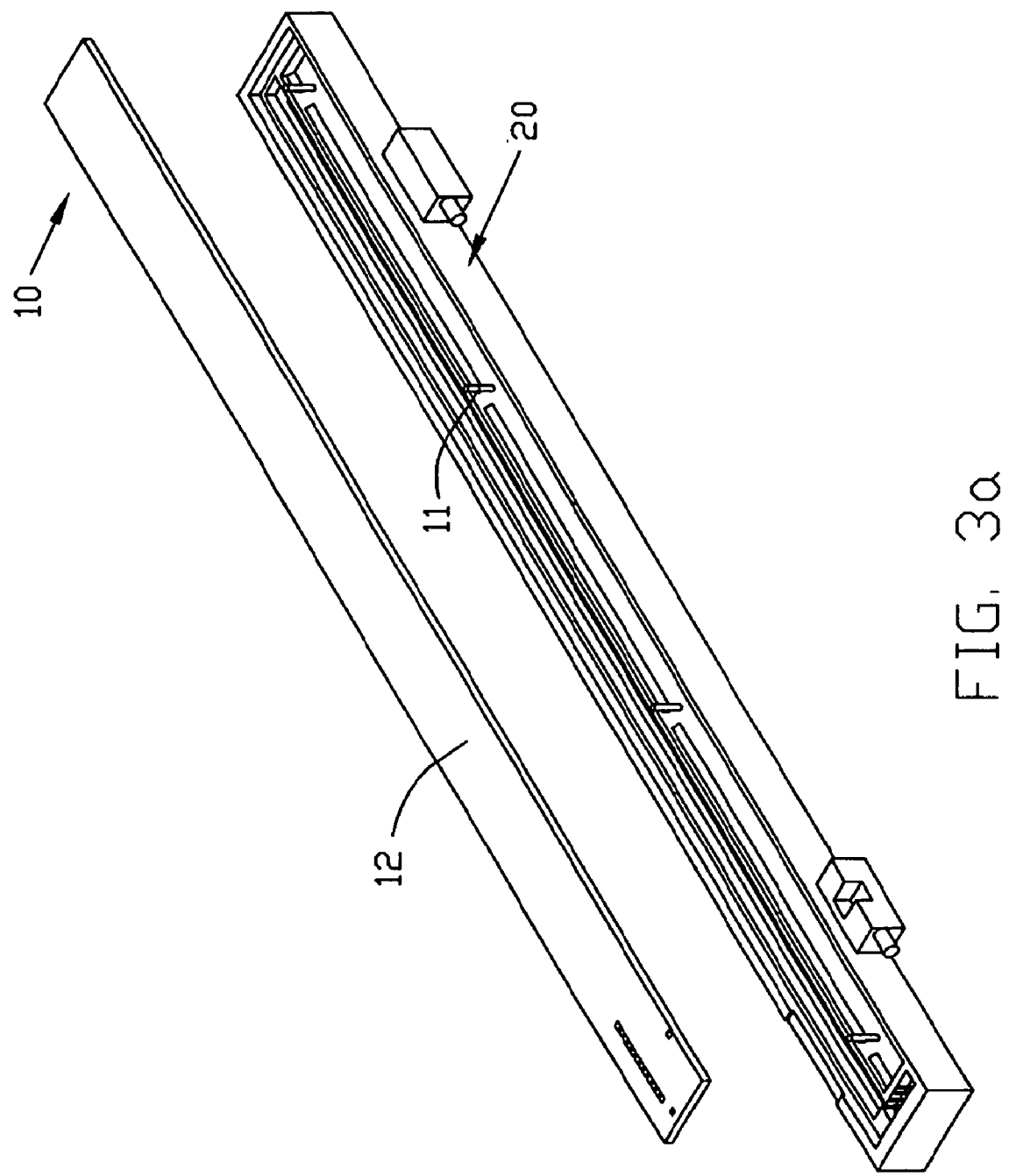
FIG. 3a is a schematic view illustrating a second prior method for assembling the PCB into the sensor housing of the prior CIS.
Figure 3B:
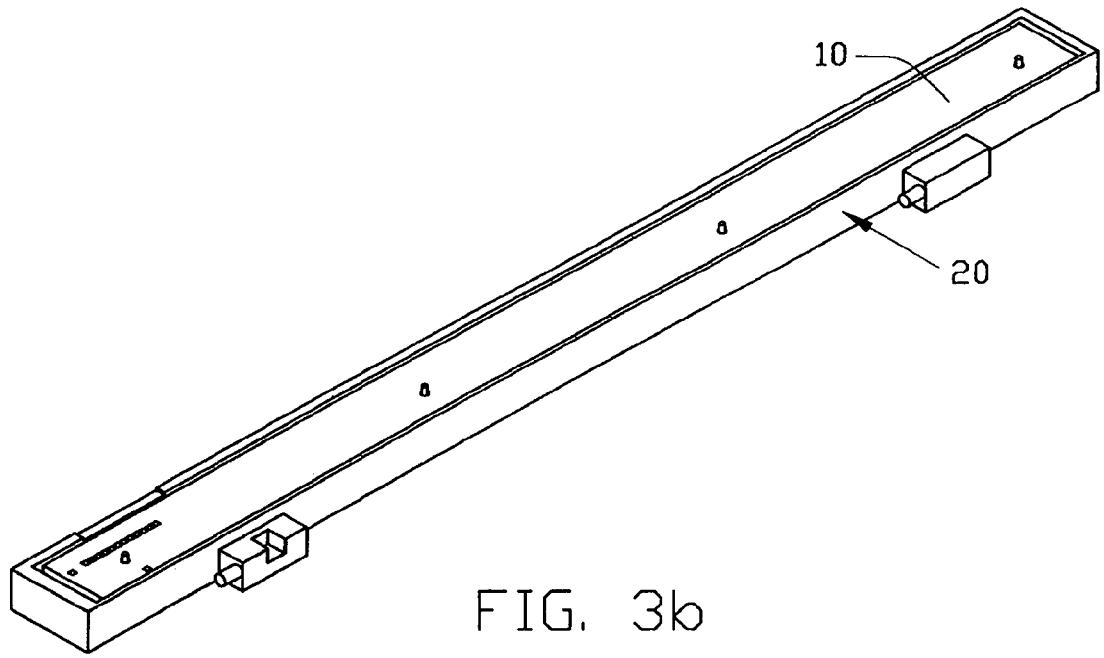
Figure 3C:
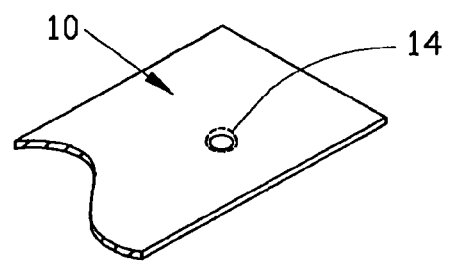
FIG. 3c is an enlarged partial view of the PCB having a fastening means formed by hot-press machine.

The sensor housing 20 is made by plastic material and has a first surface 21 (as shown in FIG. 2a) and a second surface 22 (as shown in FIG. 2b). Please also refer to FIGS. 4a and 4b; there are three grooves on the first surface 21. The first groove is a lens-receiving groove 26 which penetrate to the second surface 22. A second groove includes a plurality of tails-receiving openings 28 being adapted to receive the conductive tails 43 of the LED source 40. A third groove 25 has a plurality of securing posts 81 formed therein and surrounded with sidewalls 24, wherein said securing posts 81 are molded by the same plastic material as the sensor housing 20 and correspond to a plurality of securing holes 12 on the PCB 10 for fastening the PCB 10 to the sensor housing 20, and each of the securing posts 81 has a predetermined base portion 83 with a larger outer diameter then the other tip end of the securing post 81.

The lens-receiving groove 26 and a light source-receiving groove 27 which is exposed to the second surface 22, wherein the lens-receiving groove 26 is used to receive a rod lens 30 gathering the reflected lights and sending them to the PCB 10, the light source-receiving groove 27 is used to receive the LED source 40 and has a plurality of tails-receiving openings 28 penetrating to said second surface 22 for receiving the conductive tails 43 of the LED source 40 which connected to the PCB 10.

For clearly illustrating the assembly process of the CIS, the assembly process is separated into two periods. As same as the prior arts, the rod lens 30 and the LED source 40 are all glued on the sensor housing 20 when completing the first period of assembly process.

Figure 4A:
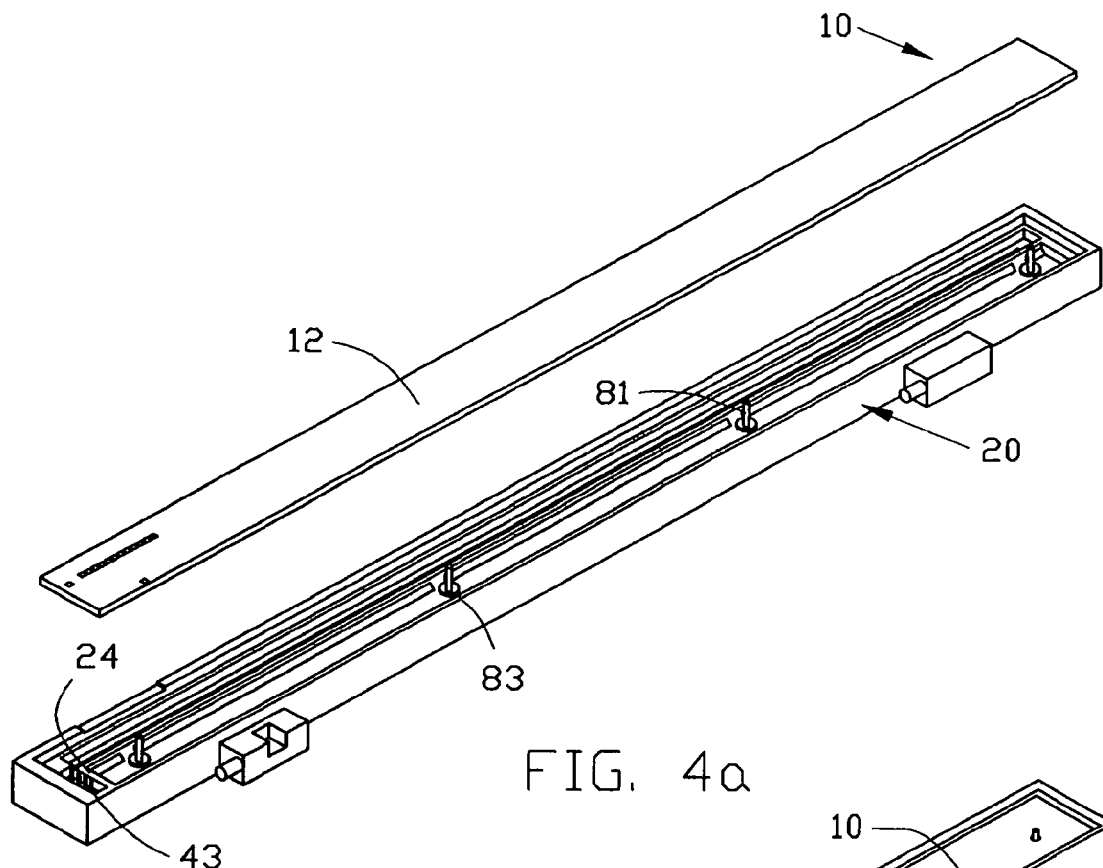
FIG. 4a is a schematic view illustrating a new method for assembling the CIS according to the present invention.
Figure 4B:
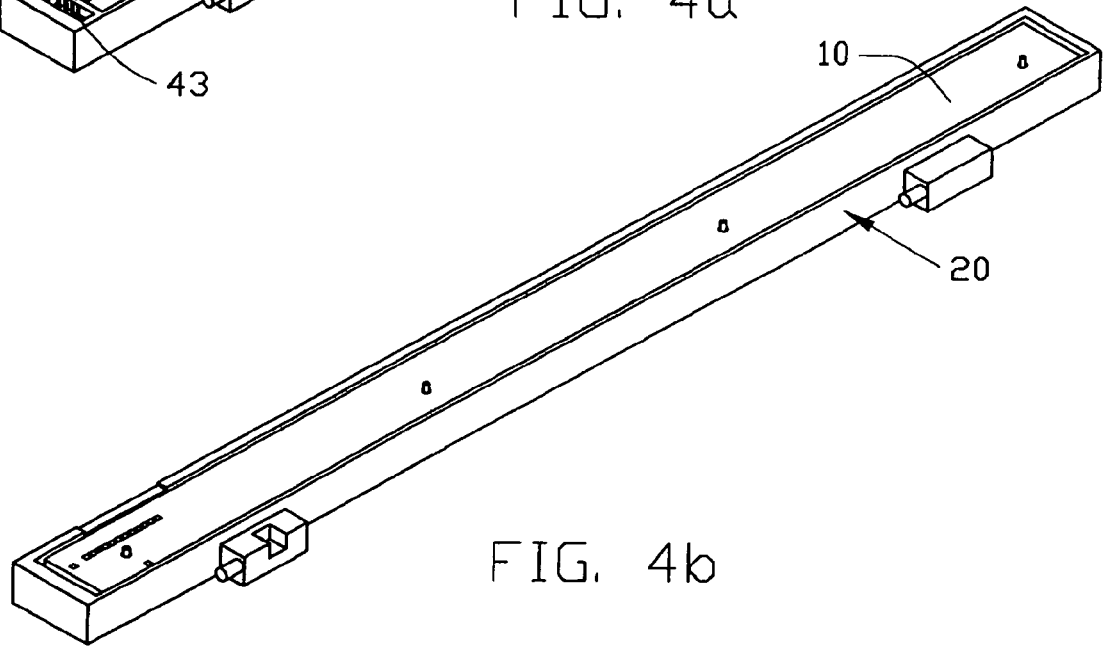

Referring to the secondary period of assembly process shown in FIGS. 4a and 4b. The PCB 10 locates on the sensor housing 20 and fixed by the securing posts 81, each tips of securing posts 81 will melt and form into a fastening means by hot-press machine.

Figure 5:
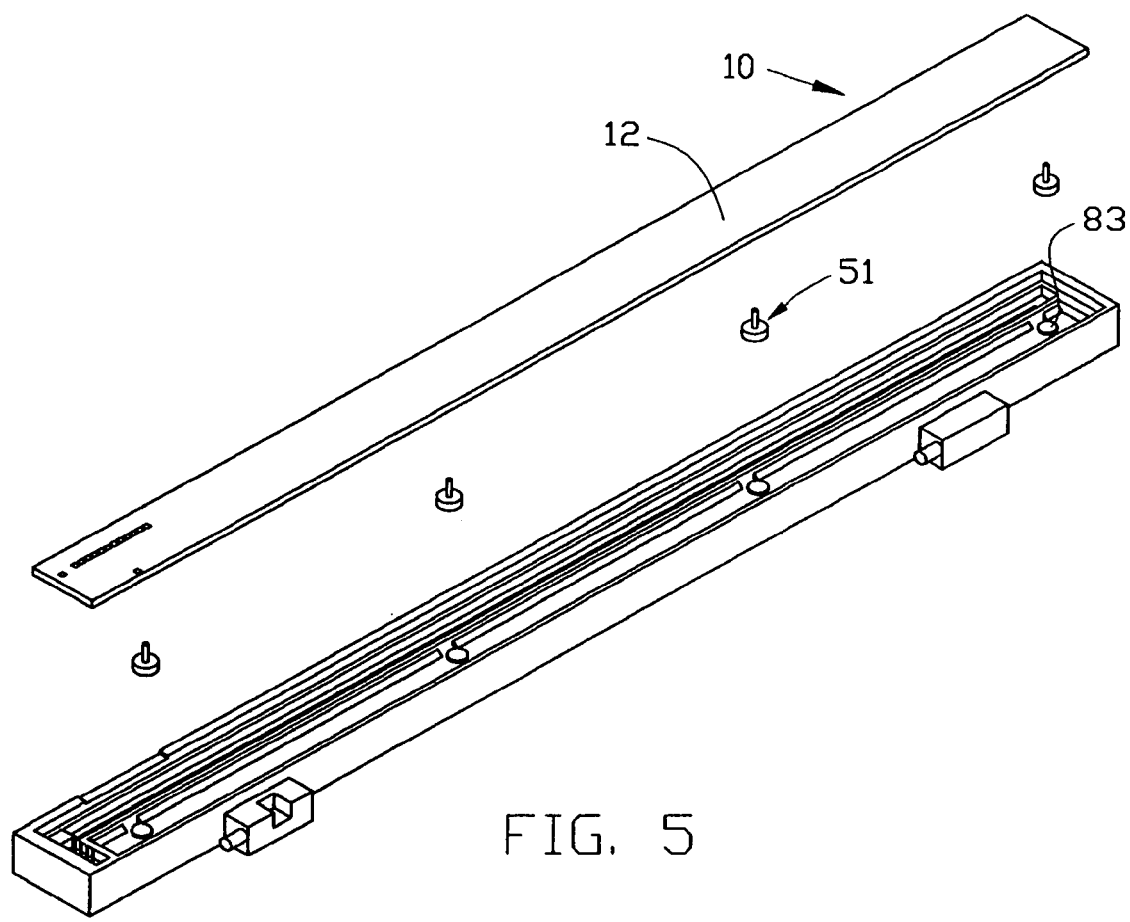
FIG. 5 is a schematic view illustrating a new method for repairing the CIS according to the present invention.

If a substandard product appears after completing the assembly process of the CIS, manufacturer will try to repair or recover it for increasing quality rate and decreasing cost. In the first step, manufacturer must cut off the fastening means which pressed and fixed on the PCB 10 and take away the PCB 10, and then root out the securing posts 81 and remain the base portions 83 of the securing posts 81 only (as shown in FIG. 5).

Figure 6:
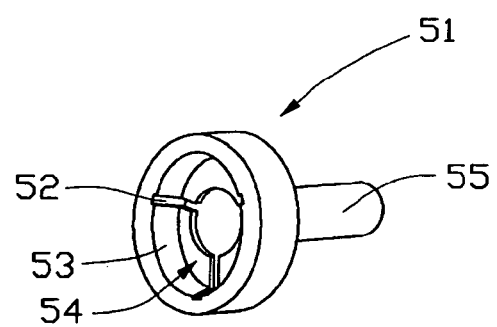
FIG. 6 is a perspective view of an adapted post employed in the process of repairing the CIS according to the present invention.

After repairing the PCB 10 or the optical components in the sensor housing 20, a plurality of adapted posts 51 provided by the present invention will cover the corresponding bases 83 in the sensor housing 20. As shown in FIG. 6, each of the adapted posts 51 includes a hollow portion 54 having an internal sidewall 53 and a securing tip 55 extending outward from the top surface of the hollow portion 54. Manufacturer has inject glue into the hollow portions 54 and covered the securing bases 83 with hollow portions 54, so that the adapted posts 51 are fixed on the base portions 83 in the sensor housing 20. After glued the adapted posts 51, the sensor housing 20 has a plurality of securing tips 55 again and provides the same function as the original posts 81 to securing the PCB 10. The securing tips 55 of the adapted posts 51 pass through the holes 12 of the PCB 10 when the PCB 10 laid on the housing 20. Each securing tips 55 will melt and form a fastening means by hot-press machine.

Several cavities 52 formed on the internal sidewall 53 are designed for filling with the surplus glue and make the internal sidewall 53 uneven to increasing the bonding force between the internal sidewall 53 of the hollow portion 55 and the securing base 83.

It can be understood that the manner of hot-press is only a preferred embodiment of this invention. In fact, the manner of rivet joint is also useful in fixing the PCB 10 to the housing 20 if changing the material and manufacturing process of the adapted post. It is apparent to those skilled in the art that a variety of modifications and changes may be made without departing from the scope of the present invention which is intended to be defined by the appended claims.

The invention claimed is:

1. A method for repairing and assembling contact image sensor (CIS) module, comprising following steps:
   (1) preparing a sensor housing having a first surface, a second surface, at least a securing post, and a plurality of receiving grooves being adapted to receive a plurality of optical elements;
   (2) preparing a PCB having photosensor elements, electronic elements and circuits thereon and being adapted to receive the light signals produced by the said optical elements and convert said light signals into the electrical signals, said PCB further having at least a securing hole on a predetermined position thereof;
   (3) assembling the PCB into the sensor housing, the securing post of the sensor housing passing through the securing hole and extending through the PCB;
   (4) melting the tip of the securing post and forming a fastening means for fixing the PCB to the sensor housing;
   (5) testing the assembled CIS module, if the module can't pass the test, then doing the following steps:
   (6) cutting off the fastening means and taking away the PCB for repairing or replacing;
   (7) cutting off the securing post located on the sensor housing;
   (8) preparing a adapted post having a predetermined length of securing post and fixing said adapted post to a corresponding position of the sensor housing on which the original securing post located;
   (9) assembling the repaired or replaced PCB into the sensor housing, and make the tip of the adapted post passing through the securing hole and extending outwardly from the PCB;
   (10) melting the tip of the adapted post and forming a fastening means for fixing the repaired or replaced PCB to the sensor housing;
   (11) testing the repaired CIS module, if need, repeat the steps from step (6) to step (11) until the CIS passes the test.

2. The method for repairing and assembling contact image sensor module as claimed in claim 1, wherein the sensor housing has a plurality of molded securing posts therewith, each securing post having a securing base near the bottom to connect to the sensor housing thereof, the outer diameter of said base being larger than the outer diameter of the tip of securing post.

3. The method for repairing and assembling contact image sensor module as claimed in claim 2, wherein the adapted post has a hollow portion, the inside diameter of said hollow portion being a little larger than the outside diameter of the securing base, so that said hollow portion of the adapted post can cover the securing base.

4. The method for repairing and assembling contact image sensor module as claimed in claim 3, wherein the inside surface of the hollow portion has at least a cavity thereon, with identified shape to making the sidewall uneven.

5. The method for repairing and assembling contact image sensor module as claimed in claim 4, wherein the adapted post is glued to the securing base, and the surplus glue being filled into the cavity of the hollow portion during the process of gluing.

6. The method for repairing and assembling contact image sensor module as claimed in claim 1, wherein the optical element in the sensor housing at least include a rod lens and a LED light source.

7. The method for repairing and assembling contact image sensor module as claimed in claim 6, wherein LED light source comprises a LED and an optical rod.

8. A method for manufacturing an electrical device, comprising following steps:
   (1) preparing a housing of an electrical device having a portion made of thermoplastic material, said portion including at least a securing post made of thermoplastic material;
   (2) preparing a circuit board having electronic elements and circuits thereon and being adapted to process the electrical signals, said circuit board further having at least a securing hole on a predetermined position thereof;
   (3) assembling said circuit board into the housing, the securing post of the housing passing through the securing hole and extending outwardly from the circuit board;
   (4) melting the tip of the securing post by the manner of hot-press and forming a fastening means for fixing the circuit board to the housing;
   (5) testing the assembled electrical device, if the device can't pass the test, then doing the following steps:
   (6) cutting off the fastening means and taking away the circuit board for repairing or replacing it;
   (7) cutting off the securing post located on the housing;
   (8) preparing a adapted post having a predetermined length of securing post and fixing the adapted post to a corresponding position of the housing on which the former securing post located;
   (9) assembling the repaired or replaced circuit board into the housing, and make the tip of the adapted post passing through the securing hole and extending outwardly from the circuit board;
   (10) melting the tip of the adapted post by the manner of hot-press and forming a fastening means for fixing the repaired or replaced circuit board to the housing;
   (11) testing the repaired electrical device, if need, repeat the steps from step (6) to step (11) until the device passes the test.

9. The method for manufacturing a electrical device as claimed in claim 8, wherein the housing has a plurality of plastic-molded securing posts, each of said securing post having a securing base near the bottom thereof, and the base's outside diameter being larger than the outer diameter of the tip of securing post.

10. The method for manufacturing a electrical device as claimed in claim 9, wherein the adapted post has a hollow portion, the inside diameter of said hollow portion being a little larger than the outside diameter of said securing base, so that said hollow portion of the adapted post can cover the securing base.

11. The method for manufacturing an electrical device as claimed in claim 10, wherein the sidewall hollow portion has at least a cavity with identified shape to making the sidewall uneven.

12. The method for manufacturing an electrical device as claimed in claim 11, when the adapted post is glued to the securing base, the surplus glue being filled into said cavity of the hollow portion during the process of gluing.

13. An adapted post is used in the method for repairing and assembling the circuit board described by claim 1.

14. The method for repairing and assembling contact image sensor module as claimed in claim 5, wherein the optical element in the sensor housing at least include a rod lens and a LED light source.

15. An adapted post is used in the method for repairing and assembling the circuit board described by claim 8.

* * * * *